United States Patent

Herman et al.

(10) Patent No.: US 7,773,365 B2
(45) Date of Patent: Aug. 10, 2010

(54) DIELECTRIC MATERIAL

(75) Inventors: Gregory S. Herman, Albany, OR (US);
Peter Mardilovich, Corvallis, OR (US);
Douglas Keszler, Corvallis, OR (US);
Jeremy Anderson, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1299 days.

(21) Appl. No.: 10/837,411

(22) Filed: Apr. 30, 2004

(65) Prior Publication Data
US 2005/0242330 A1 Nov. 3, 2005

(51) Int. Cl.
*H01G 4/10* (2006.01)
*B05D 1/26* (2006.01)
*B05D 5/12* (2006.01)

(52) U.S. Cl. ............. 361/321.1; 361/311; 427/79; 427/96.1; 427/126.3; 427/240; 427/427; 427/430.1; 257/213; 252/578

(58) Field of Classification Search ............ 427/79, 427/96.1, 126.1, 126.3, 240, 427, 430.1; 252/570, 578; 361/311, 321.1; 257/213
See application file for complete search history.

(56) References Cited

U.S. PATENT DOCUMENTS

| | | | |
|---|---|---|---|
| 4,511,860 A | 4/1985 | Bastida | |
| 4,994,821 A * | 2/1991 | Fagerquist | 347/81 |
| 5,025,094 A * | 6/1991 | King | 568/623 |
| 5,322,559 A | 6/1994 | Sleight | |
| 5,433,778 A | 7/1995 | Sleight | |
| 5,514,360 A | 5/1996 | Sleight et al. | |
| 6,183,716 B1 | 2/2001 | Sleight et al. | |
| 6,583,071 B1 * | 6/2003 | Weidman et al. | 438/787 |
| 6,844,604 B2 * | 1/2005 | Lee et al. | 257/410 |
| 2003/0027704 A1 | 2/2003 | Sakatani et al. | |
| 2004/0002223 A1 | 1/2004 | Nallan | |
| 2004/0011245 A1 * | 1/2004 | Sambasivan et al. | 106/14.12 |
| 2004/0137660 A1 * | 7/2004 | Murata | 438/106 |
| 2004/0180988 A1 * | 9/2004 | Bernius et al. | 523/160 |
| 2004/0206267 A1 * | 10/2004 | Sambasivan et al. | 106/15.05 |
| 2005/0151270 A1 * | 7/2005 | Jones | 257/783 |
| 2006/0281961 A1 * | 12/2006 | Prasad | 588/300 |

FOREIGN PATENT DOCUMENTS

| | | |
|---|---|---|
| GB | 2126256 A | 3/1984 |
| JP | 1222469 | 9/1989 |
| JP | 5017177 | 1/1993 |
| JP | 2001110675 | 4/2001 |

OTHER PUBLICATIONS

Database WPI, Section Ch, Week 200313, Derwent Publications Ltd, London, GB; Class L03, AN 2002-641287, XP002334346 & KR 349 363 B (Hynix Semiconductor Inc) Aug. 21, 2002.
Database WPI, Section Ch, Week 198108, Derwent Publications Ltd, London, GB; Class L01, AN 1981-13303D, XP002334347 & SU 742 398 B (Blinov V A) Jun. 28, 1980.
Database WPI, Section Ch, Week 199510, Derwent Publications Ltd, London, GB; Class L03, AN 1995-071414, XP002334348 & JP 06 349330 A (TDK Corp) Dec. 22, 1994.

* cited by examiner

*Primary Examiner*—Kirsten C Jolley

(57) ABSTRACT

One embodiment of a dielectric material may include a metal containing cation and a polyatomic anion.

36 Claims, 3 Drawing Sheets

DIELECTRIC MATERIAL

BACKGROUND

Dielectric materials may be used in the formation of electronic devices. A relatively low dielectric constant, breakdown voltage, and/or dielectric strength of a dielectric material may limit its usefulness in some types of electronic devices.

DETAILED DESCRIPTION OF THE DRAWINGS

Figure 1:
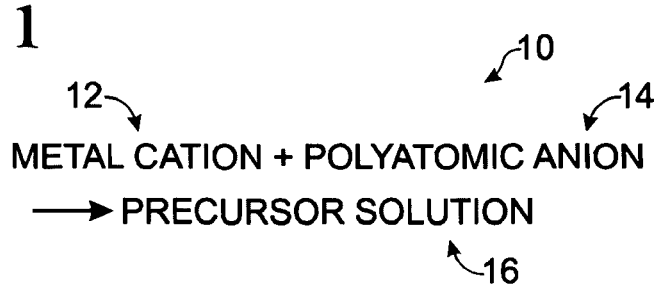
FIG. 1 is a reaction of one embodiment of a process of manufacturing an embodiment of a dielectric precursor material.

FIG. 1 is a reaction of one embodiment of a process of manufacturing a dielectric precursor material in accordance with one embodiment of the present disclosure. In general, the process 10 of manufacturing a dielectric material may comprise providing a first reactant 12, such as a metal containing cation, providing a second reactant 14, such as a polyatomic anion, and then reacting the polyatomic anion and the metal containing cation. The metal containing cation and the polyatomic anion may be in solution, such as an aqueous solution of water, when reacted together. In one embodiment, the metal containing cation in solution, such as hafnium suboxide ($HfO^{2+}$), may be provided by providing an aqueous solution of hafnium oxy chloride ($HfOCl_2(aq)$) and the polyatomic anion in solution, such as sulfate ($SO_4^{2-}$), may be provided by providing an aqueous solution of sulfuric acid ($H_2SO_4(aq)$). These two reactants may be mixed together and may further be heated and/or aged. The reaction may produce a precursor solution 16 which may be immediately applied as desired, such as being applied on a substrate, or may be at least partially dehydrated and then applied. In the example given above, the precursor solution may then form hafnium oxy-hydroxy sulfate ($HfO_{2-x-z/2}(OH)_z(SO_4)_x$), wherein x and z may be fixed or variable, may have any value, such as a value for x in a range of 0.1 to 1.9, and a value for z in a range of 0.0 to 2.0, and in one embodiment may have a value of x=0.5 and z=0. Due to possibility of OH— groups to be a part of the metal containing cation, the compound may comprise hafnium oxy-hydroxy sulfate ($HfO_{2-x-z/2}OH_z(SO_4)_x$).

In other embodiments, the polyatomic anion may include one or more of sulfate ($SO_4^{2-}$), borate ($BO_3^{3-}$), phosphate ($PO_4^{3-}$), tungstate ($WO_4^{2-}$) and silicate ($SiO_4^{4-}$). The metal containing cation may comprise a metal suboxide, and may include one or more of hafnium ($Hf^{4+}$), titanium ($Ti^{4+}$), zirconium ($Zr^{4+}$), cerium ($Ce^{4+}$), tin ($Sn^{4+}$), tantalum ($Ta^{5+}$), niobium ($Nb^{4+}$), yttrium ($Y^{3+}$), molybdenum ($Mo^{4+}$), tungsten ($W^{6+}$), aluminum ($Al^{3+}$), gallium ($Ga^{3+}$), zinc ($Zn^{2+}$), chromium ($Cr^{3+}$), iron ($Fe^{3+}$), bismuth ($Bi^{3+}$), lanthanides, hafnium oxy-hydroxide ($HfO_y(OH)_z^{(4-2y-z)+}$), zirconium oxy-hydroxide ($ZrO_y(OH)_z^{(4-2y-z)+}$), titanium oxy-hydroxide ($TiO_y(OH)_z^{(4-2y-z)+}$), tantalum oxy-hydroxide ($TaO_y(OH)_z^{(5-2y-z)+}$), yttrium oxy-hydroxide ($YO_y(OH)_z^{(3-2y-z)+}$) niobium oxy-hydroxide ($NbO_y(OH)_z^{(4-2y-z)+}$), molybdenum oxy-hydroxide ($MoO_y(OH)_z^{(4-2y-z)+}$), tungsten oxy-hydroxide ($WO_y(OH)_z^{(6-2y-z)+}$), aluminum oxy-hydroxide ($AlO_y(OH)_z^{(3-2y-z)+}$), gallium oxy-hydroxide ($GaO_y(OH)_z^{(3-2y-z)+}$), zinc oxy-hydroxide ($ZnO_y(OH)_z^{(2-2y-z)+}$), chromium oxy-hydroxide ($CrO_y(OH)_z^{(3-2y-z)+}$), iron oxy-hydroxide ($FeO_y(OH)_z^{(3-2y-z)+}$), bismuth oxy-hydroxide ($BiO_y(OH)_z^{(3-2y-z)+}$), and oxy-hydroxides of the lanthanide series. The value of y is related to the charge on the metal cation and the amount of hydroxide and other polyatomic anion that is bound to the metal cation. For the case of a final dielectric film comprising $HfO_{2-x-z/2}OH_z(SO_4)_x$, y=2-x-z/2.

Accordingly, the polyatomic anions and metal containing cations utilized in the present disclosure may result in a dielectric precursor material not using organics for forming complexes, i.e., the sources of the anion and the cation do not contain organics. However, a non-complexing organic, such as ethanol, may be used as a partial solvent in the precursor solution. Due to the absence of complexing organics in the precursor material, once the precursor solution is applied to a substrate, the precursor solution does not have to be heated or annealed at temperatures as high as 400° C. or higher, to decompose/combust any organic materials. Polymerization of the precursor solution upon heating and/or drying results in the formation of amorphous films and not polycrystalline materials, thereby allowing solutions-based-application of the dielectric material on a substrate.

In general, the process of the present disclosure may be conducted at atmospheric pressure in ambient air. Accordingly, vacuum processing is not used but may be utilized if desired. The process may be conducted at a temperature in a range of approximately 80 to 850° C., but may also be conducted in a temperature range of approximately 80 to at most, 350° C., or at a temperature of at most 100° C. These low pressure and low temperature processing steps may reduce the energy usage of the process of the present disclosure. Due to the low temperatures which may be utilized for processing of the dielectric films, the films may be processed on or applied as a solution to low temperature substrates, such as plastic substrates. The amorphous, non-crystalline dielectric precursor solution produced may allow even, conformal coverage of the precursor solution on a substrate, such as on a wafer. The solution may also be applied in a predetermined, specific pattern by inkjet printing so that no masking or etching steps are used. Accordingly, the process of the present disclosure may eliminate or reduce the usage of hazardous or toxic materials that may be used for the formation and removal of materials during photolithography processing on substrates so that the present process may be time efficient and environmentally "green." Moreover, the hafnium oxide and sulfate materials utilized in one example embodiment of the present disclosure may not be considered toxic materials.

More particularly, the materials utilized in the process of the present disclosure may belong to the family of compounds including hafnium oxy hydroxy sulfates ($HfO_{2-x-z/2}OH_z(SO_4)_x$), hafnium oxy hydroxy tungstates ($HfO_{2-x-z/2}OH_z(WO_4)_x$), hafnium oxy hydroxy borates ($HfO_{2-x-z/2}OH_z(BO_3)_x$), hafnium oxy hydroxy phosphates ($HfO_{2-x-z/2}OH_z(PO_4)_x$), and hafnium oxy hydroxy silicates ($HfO_{2-x-z/2}OH_z(SiO_4)_x$). These materials may be polymerized at temperatures as low as 80 degrees Celsius (° C.) and may remain amorphous up to approximately 740° C., and even as high as 1200° C. The polymerization of the materials may be controlled by the heating rate, by co-solvents, or by other methods. The amorphous character of the films of the present disclosure may reduce the formation of defects at grain boundaries and may reduce the formation of cracks upon an amorphous to crystalline transition. Moreover, the dielectric films of the present disclosure may have a reasonably high dielectric constant, i.e., a dielectric constant higher than the dielectric constant of organic compounds. The ability to form high quality dielectrics by solution based processing, such as inkjet printing applications, may allow the formation of low cost electronic components, such as field effect transistors or capacitors, for low cost electronic applications.

Figure 2:
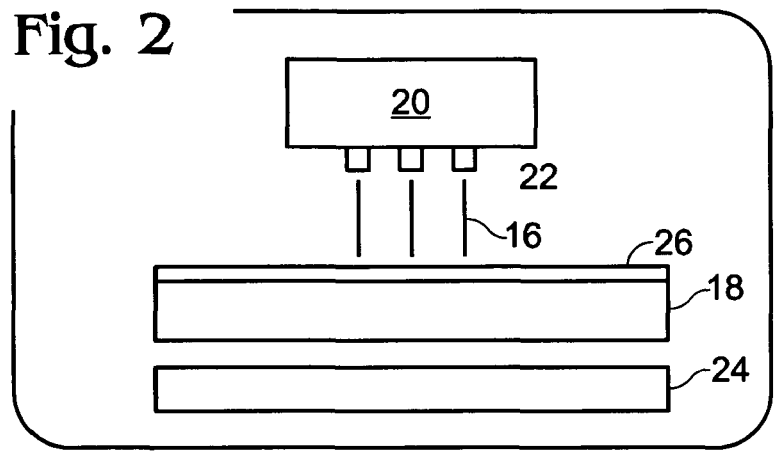
FIG. 2 is a schematic showing one embodiment of a process of applying an embodiment of a precursor solution for formation of an embodiment of a dielectric material.

FIG. 2 shows schematically one embodiment of a process of applying precursor solution 16 for formation of a dielectric material. Precursor solution 16, such as hafnium oxy sulfate, may be applied to a substrate 18, such as a wafer, by an applicator 20. In one embodiment, applicator 20 may comprise an inkjet printer having nozzles 22 (shown schematically extending from applicator 20 for ease of illustration) wherein the aqueous precursor solution 16 may be ejected through nozzles 22 of the inkjet printer. In other embodiments, applicator 20 may comprise a spin-coater, a dip-coater, or a spray-coater such that the method of applying the precursor solution may comprise, respectively, spin-coating, dip-coating, or spray-coating. Due to the amorphous solution based properties of precursor solution 16, precursor solution 16 may allow good conformal coverage when applied. Once applied to the surface of the substrate, or to a film or films deposited on the substrate, the precursor solution may be dehydrated, such as by heating with a heater 24, or by other dehydration devices, to remove or reduce the amount of water in the precursor solution. This dehydration step may result in the precipitation of an amorphous dielectric material 26, such as a hafnium oxy sulfate thin film, on wafer 18.

Figure 3:
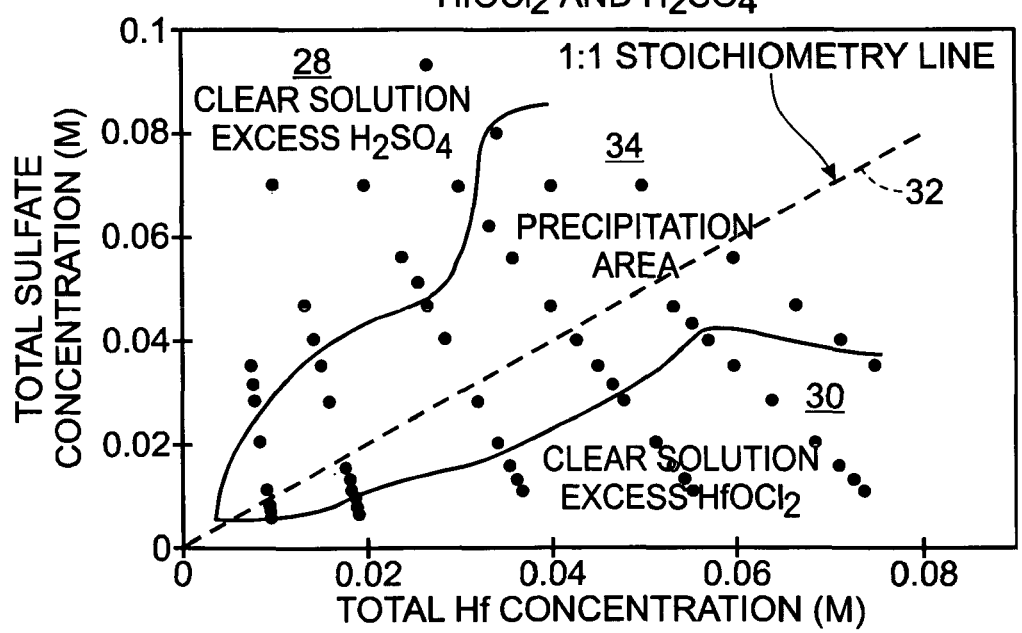
FIG. 3 is a graph showing possible solution concentrations for differing precursor concentrations for one embodiment of a dielectric material.

FIG. 3 is a graph showing possible solution concentrations for differing precursor concentrations for one embodiment of dielectric material precursor solutions 16 (see FIG. 1), in particular, for the reaction of sulfuric acid ($H_2SO_4$) with hafnium oxy chloride ($HfOCl_2$). More particularly, FIG. 3 shows a graph of total sulfate concentration (molarity (M)) versus total hafnium concentration (M). Region 28 represents a clear solution, i.e., a solution with no visually detectable precipitate therein, wherein region 28 is a region of excess sulfuric acid ($H_2SO_4$). Region 30 represents a clear solution, i.e., a solution with no visually detectable precipitate therein, wherein region 30 is a region of excess hafnium oxy chloride ($HfOCl_2$). Line 32 represents a stoichiometric line wherein sulfuric acid and hafnium oxy chloride are each present in a one-to-one ratio (1:1 stoichiometric ratio). Region 34 may represent a precipitation area, i.e., a solution having a visually detectable precipitate therein, i.e., a solution having solids therein. Region 34, or portions thereof, therefore, may represent solutions that may not be suited for forming smooth substantially defect free films by inkjet printing applications, or other methods, on a substrate through nozzles 22 (see FIG. 2) of an inkjet printer. Accordingly, when precursor solution 16 (see FIG. 2) is applied through an inkjet printer application device 20 (see FIG. 2), it may be desirable that the concentration of the first and second reactants fall within either of regions 28 or 30, but not within solids region 34, because solids present in the solutions of region 34 may occlude nozzles 22, may form an unsmooth film, or may otherwise result in unfavorable application of the precursor solution. In other words, the solutions of regions 28 and 30 may represent possible precursor solution "inks" that may be applied through an inkjet printhead or by a dropper method.

Still referring to FIG. 3, the solutions of region 34 may initially appear clear but may show a visually detectable precipitate therein over an extended period of time, such as after several hours. Accordingly, solutions inside precipitation area 34 may be used for printing, spraying, or dip-coating when the solution is deposited while still soluble. Heating and other disturbances may decrease the time in which precipitation occurs. In another embodiment, the solutions of region 34 may be effectively deposited by a multi-solution approach. For example, a dual printer head application would allow the polyatomic anion and the metal cation to be deposited separately, resulting in the formation of a solution in the range of region 34 on the substrate surface. Though potentially short-lived, the solution of region 34 deposited on the substrate would be the precursor solution for a solid film formed thereon.

Figure 4:
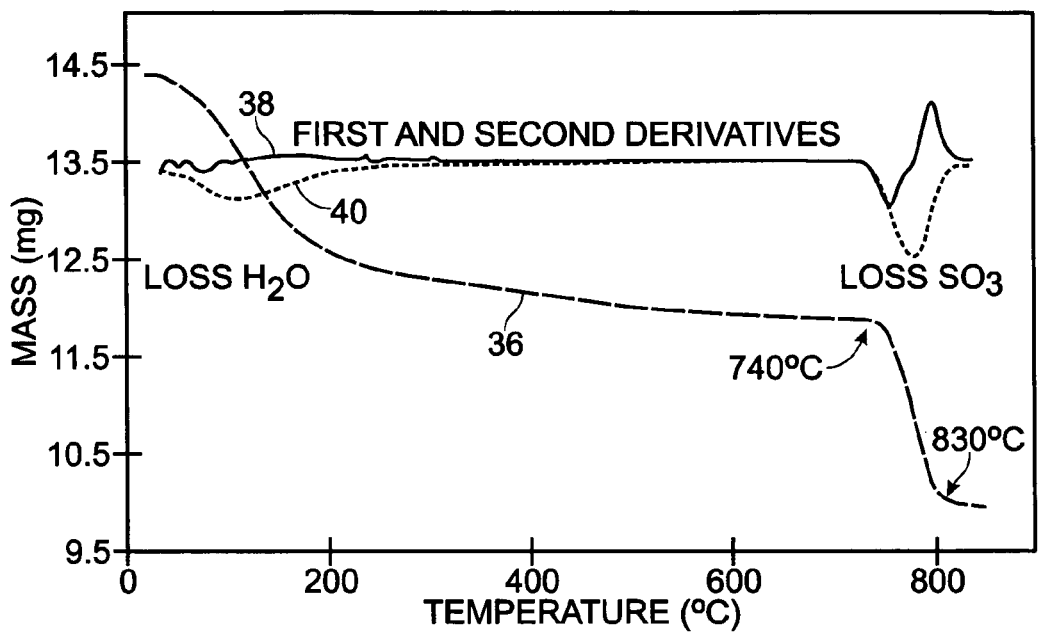
FIG. 4 is a graph showing mass versus temperature for one embodiment of a dielectric material.

FIG. 4 is a graph showing mass (milligrams (mg)) versus temperature (degrees Celsius (° C.)) for one embodiment of a dielectric material. In particular, FIG. 4 is a Thermal Gravametric Analysis (TGA) for one embodiment of a finished bulk dielectric material 26 (see FIG. 2), namely, hafnium oxy hydroxy sulfate ($HfO_{2-x-z/2}OH_z(SO_4)_x$), which has been precipitated and lightly dried. (TGA characteristics may be different for films of varied preparation and concentration levels.) In particular, line 36 represents the mass of dielectric material 26 at a variety of temperatures. During the temperature range of approximately 100 to 200° C., i.e., the drying or dehydration step of the process of the present disclosure, the mass of the hafnium oxide sulfate changes from approximately 14.5 mg to approximately 12.5 mg due to a loss of water ($H_2O$). During the temperature range of approximately 200 to 740° C. the mass of the hafnium oxide sulfate is approximately steady at about 12.5 mg. During the temperature range of approximately 740 to 830° C., the mass of the hafnium oxide sulfate drops to approximately 10.0 mg due to a loss of $SO_3$. Accordingly, in one embodiment a dielectric film 26 (see FIG. 2) manufactured of hafnium oxide sulfate may be heated to as much as approximately 740° C. without substantial mass degradation from the loss of $SO_3$.

Line 38 is a first derivative of line 36 and, therefore, represents minimum and maximum points of line 36. Line 40, is a second derivative of line 36 and, therefore, represents the inflection points of line 36.

Figure 5:
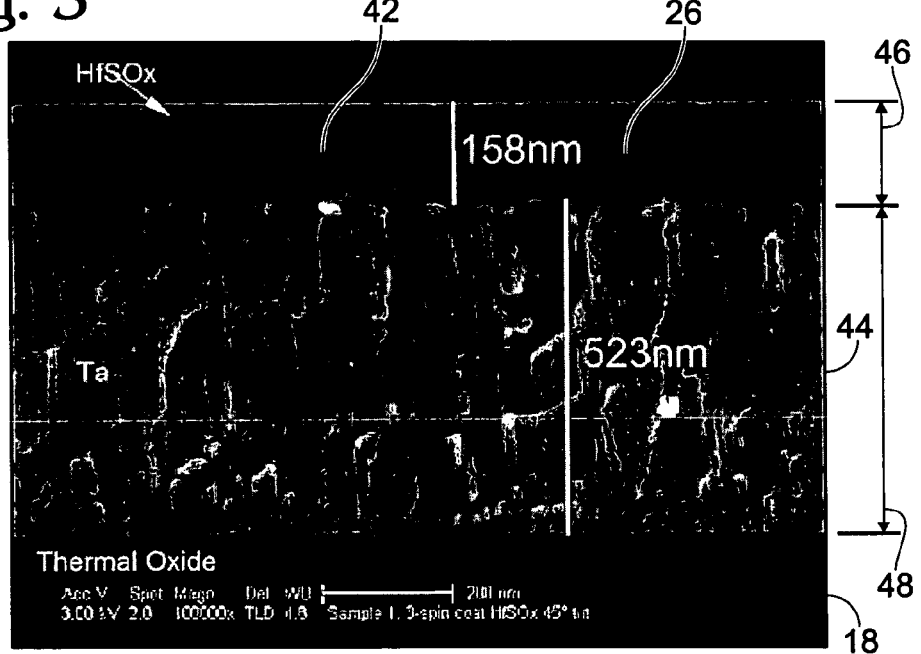
FIG. 5 is a cross sectional side view photograph of one embodiment of a dielectric material on a substrate.

FIG. 5 is a cross sectional side view photograph of one embodiment of a dielectric material on a substrate, namely, a hafnium oxide sulfate thin film 42 on a tantalum layer 44, which is on a substrate 18, such as a plastic substrate. In the embodiment shown, thin film 42 may have a thickness 46 of approximately 158 nanometers (nm) and tantalum layer 44 may have a thickness 48 of approximately 523 nm.

The dielectric constant of the example embodiment of thin film 42 of FIG. 5 was measured to be at least 10. In other embodiments, the dielectric constant of the dielectric material was at least 5.0, and in other embodiments, at least 13.0. The addition of dopant cation species may further increase the dielectric constant. In particular, dopant cations such as titanium ($Ti^{4+}$), zirconium ($Zr^{4+}$), cerium ($Ce^{4+}$), tin ($Sn^{4+}$), tantalum ($Ta^{5+}$), niobium ($Nb^{4+}$), hafnium ($Hf^{4+}$), yttrium ($Y^{3+}$), molybdenum ($Mo^{4+}$), tungsten ($W^{6+}$), aluminum ($Al^{3+}$), gallium ($Ga^{3+}$), zinc ($Zn^{2+}$), chromium ($Cr^{3+}$), iron ($Fe^{3+}$), bismuth ($Bi^{3+}$), lanthanides, and mixtures thereof, may be added to first and second reactants 12 or 14 (see FIG. 1) or to precursor solution 16 (see FIG. 1). The cation dopant may be added in a range of 1 cation atomic percent to 50 cation atomic percent of said solution, or any other percent values as may be appropriate for a particular application. Dielectric material 26 having a cation dopant therein may have dielectric constants measured up to a value of 15, and in some cases, such as a titanium dopant, a dielectric constant value of approximately 40 is possible.

Film 42 was subjected to decomposition tests. In particular, film 42 was subjected to an acidic solution of nitric acid and showed no discernable decomposition. Film 42 was also subjected to a basic solution of sodium hydroxide and showed no discernable decomposition. Accordingly, the dielectric material of the present disclosure may be impervious to, or substantially resistant to, chemical decomposition. Film 42 was also subjected to high temperatures, such as temperatures as high as 740° C., and showed no discernable decomposition. Accordingly, the dielectric material of the present disclosure may be impervious to, or substantially resistant to, thermal decomposition.

Figure 6:
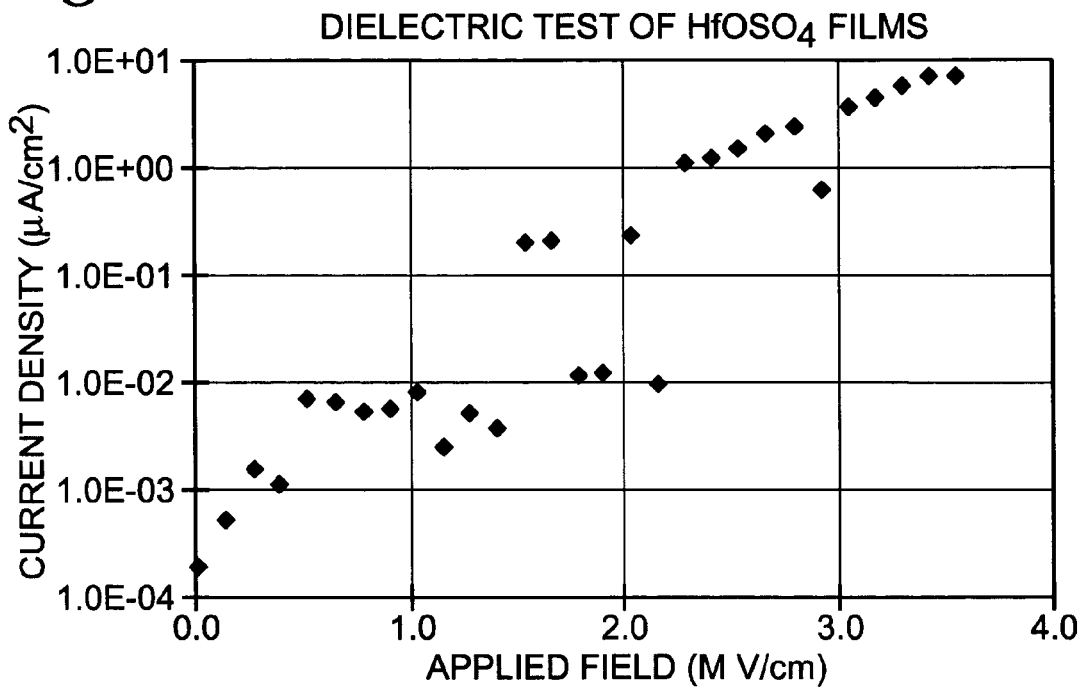
FIG. 6 is a graph showing current density versus applied field for one embodiment of a dielectric material.

FIG. 6 is a graph showing current density versus applied field for one embodiment of a dielectric material. In particular, FIG. 6 shows current density (micro amps per centimeter squared ($\mu A/cm^2$)) versus applied field (megavolt per centimeter (MV/cm)) for a hafnium oxide sulfate dielectric thin film. FIG. 6 shows that for the particular hafnium oxide sulfate dielectric thin film shown, the current density may be approximately level at $1.0\ E{-}02\ \mu A/cm^2$ for an applied field of approximately 0.5 to 1.5 MV/cm. The current density may be within a range of approximately $1.0\ E{-}02$ to $1.0\ E{+}00$ $\mu A/cm^2$ for an applied field of approximately 1.5 to 2.2 MV/cm. For applied fields greater than approximately 2.2 MV/cm, the current density is approximately $1.0\ E{+}00$ $\mu A/cm^2$ or greater. Accordingly, the hafnium oxide sulfate dielectric thin film shown may have a breakdown electric field strength of at least 2.0 MV/cm, and which may be approximately 2.2 MV/cm, i.e., the film may be destroyed by an applied electric field of 2.2 MV/cm or greater. The film may have a current density of $1.0\ E{+}00\ \mu A/cm^2$ or less for applied field strengths of approximately 2.2 MV/cm or less. In other words, up to an applied field strength of approximately 2.2 MV/cm, the hafnium oxide sulfate dielectric thin film may provide low leakage current and a relatively high breakdown voltage. In other embodiments, the breakdown electric field strength of the dielectric material was measured to be as high as 3.5 MV/cm. Accordingly, the dielectric thin film of the present disclosure may be a good insulator for metal-insulator-metal structures in electronic devices and the particular hafnium oxide sulfate dielectric thin film shown may provide favorable dielectric properties for use as a gate insulator in an electronic device.

Figure 7:
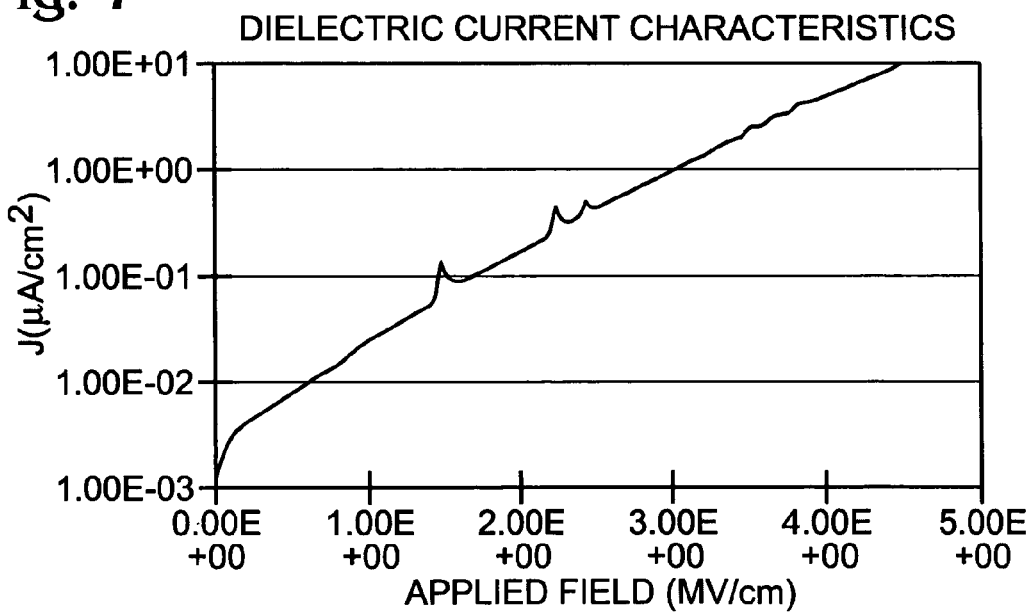
FIG. 7 is a graph showing current density versus applied field for one embodiment of a dielectric material.

FIG. 7 is a graph showing current density versus applied field for one embodiment of a dielectric material. In particular, FIG. 7 shows current density ($\mu A/cm^2$)) versus applied field (MV/cm)) for a hafnium oxide sulfate dielectric thin film. For the particular hafnium oxide sulfate dielectric thin film shown, the material thickness in Angstroms was 1975; the deposition method was spin coating; the top contact was aluminum; the bottom contact was tantalum; the substrate was silicon; the device area was 0.011 square centimeters; the calculated breakdown electric field strength was 4.54 MV/cm; and the current density at 1 MV/cm was 26.09091 $nA/cm^2$. The hafnium oxide sulfate dielectric thin film shown may have a breakdown electric field strength of at least 4.0 MV/cm, and which may be approximately 4.54 MV/cm, i.e., the film may be destroyed by an applied electric field strength of 4.54 MV/cm or greater. The film may have a current density of $1.0\ E{+}01\ \mu A/cm^2$ or less for applied electric field strengths of approximately 4.54 MV/cm or less. In other words, up to an applied electric field strength of approximately 4.54 MV/cm, the hafnium oxide sulfate dielectric thin film may provide low leakage current and a relatively high breakdown voltage.

Other materials, formation and application techniques may be utilized wherein such variations and modifications of the concepts described herein fall within the scope of the claims below.

We claim:

1. A dielectric material, comprising:
   a metal containing cation including one or more oxides, sub-oxides and sub-oxy-hydroxides; and
   a polyatomic anion including one or more of sulfate ($SO_4^{2-}$), borate ($BO_3^{3-}$), and phosphate ($PO_4^{3-}$);
   wherein said dielectric material is amorphous;
   and wherein said dielectric material comprises a film in an electronic component, said electronic component including one or more of a field effect transistor and a capacitor.

2. A dielectric material according to claim 1 wherein said polyatomic anion includes one or more of tungstate ($WO_4^{2-}$) and silicate ($SiO_4^{4-}$).

3. A dielectric material according to claim 1, wherein said dielectric material comprises a thin film on a plastic substrate.

4. A dielectric material according to claim 1 wherein said metal containing cation includes one or more of hafnium ($Hf^{4+}$), titanium ($Ti^{4+}$), zirconium ($Zr^{4+}$), cerium ($Ce^{4+}$), tin ($Sn^{4+}$), tantalum ($Ta^{5+}$), niobium ($Nb^{5+}$), yttrium ($Y^{3+}$), molybdenum ($Mo^{4+}$), tungsten ($W^{6+}$), aluminum ($Al^{3+}$), gallium ($Ga^{3+}$), zinc ($Zn^{2+}$), chromium ($Cr^{3+}$), iron ($Fe^{3+}$), bismuth ($Bi^{3+}$), lanthanides, hafnium suboxide ($HfO^{2+}$), zirconium suboxide ($ZrO^{2+}$), titanium suboxide ($TiO^{2+}$), tantalum suboxide ($TaO^{3+}$), yttrium suboxide ($YO^+$), niobium suboxide ($NbO^{3+}$), molybdenum suboxide ($MoO^{4+}$), tungsten suboxide ($WO^{4+}$), aluminum suboxide ($AlO^+$), gallium suboxide ($GaO^+$), suboxides of the lanthanide series, hafnium oxy-hydroxide ($HfO_y(OH)_z^{(4-2y-z)+}$), zirconium oxy-hydroxide ($ZrO_y(OH)_z^{(4-2y-z)+}$), titanium oxy-hydroxide ($TiO_y(OH)_z^{(4-2y-z)+}$), tantalum oxy-hydroxide ($TaO_y(OH)_z^{(5-2y-z)+}$), yttrium oxy-hydroxide ($YO_y(OH)_z^{(3-2y-z)+}$), niobium oxy-hydroxide ($NbO_y(OH)_z^{(4-2y-z)+}$), molybdenum oxy-hydroxide ($MoO_y(OH)_z^{(4-2y-z)+}$), tungsten oxy-hydroxide ($WO_y(OH)_z^{(6-2y-z)+}$), aluminum oxy-hydroxide ($AlO_y(OH)_z^{(3-2y-z)+}$), gallium oxy-hydroxide ($GaO_y(OH)_z^{(3-2y-z)+}$), zinc oxy-hydroxide ($ZnO_y(OH)_z^{(2-2y-z)+}$), chromium oxy-hydroxide ($CrO_y(OH)_z^{(3-2y-z)+}$), iron oxy-hydroxide ($FeO_y(OH)_z^{(3-2y-z)+}$), bismuth oxy-hydroxide ($BiO_y(OH)_z^{(3-2y-z)+}$), and oxy-hydroxides of the lanthanide series.

5. A dielectric material according to claim 1 wherein said dielectric material comprises $HfO_{2-x-z/2}(OH)_z(SO_4)_x$, and wherein x ranges from 0.1 to 1.9.

6. A dielectric material according to claim 1, further comprising a dopant cation including one or more of titanium ($Ti^{4+}$), zirconium ($Zr^{4+}$), cerium ($Ce^{4+}$), tin ($Sn^{4+}$), tantalum ($Ta^{5+}$), niobium ($Nb^{5+}$), hafnium ($Hf^{4+}$), yttrium ($Y^{3+}$), molybdenum ($Mo^{4+}$), tungsten ($W^{6+}$), aluminum ($Al^{3+}$), gallium ($Ga^{3+}$), zinc ($Zn^{2+}$), chromium ($Cr^{3+}$), iron ($Fe^{3+}$), bismuth ($Bi^{3+}$), and lanthanides.

7. A dielectric material according to claim 1 wherein said dielectric material is amorphous up to a temperature of 740° C.

8. A dielectric material according to claim 1 wherein said dielectric material is amorphous up to a temperature of 1200° C.

9. A dielectric material according to claim 1 wherein said dielectric material is manufactured from a precursor, and wherein said precursor comprises a solution.

10. A dielectric material according to claim 9 wherein said solution comprises a clear solution having an absence of complexing organic materials.

11. A dielectric material according to claim 1 wherein said dielectric material has a breakdown electric field strength of at least 2.0 MV/cm.

12. A dielectric material according to claim 1 wherein said dielectric material has a dielectric constant of at least 10.

13. A dielectric material according to claim 1 wherein said dielectric material comprises $HfO_{2-x-z/2}(OH)_z(SO_4)_x$, and wherein z ranges from 0.0 to 2.0.

14. A process of forming a dielectric film, comprising:
   providing a metal containing cation that includes one or more of hafnium suboxide ($HfO^{2+}$), zirconium suboxide ($ZrO^{2+}$), titanium suboxide ($TiO^{2+}$), tantalum suboxide ($TaO^{3+}$), yttrium suboxide ($YO^+$), niobium suboxide ($NbO^{3+}$), molybdenum suboxide ($MoO^{4+}$), tungsten suboxide ($WO^{4+}$), aluminum suboxide ($AlO^+$), gallium suboxide ($GaO^+$), and suboxides of the lanthanide series;
   providng a polyatomic anion including one or more of sulfate ($SO_4^{2-}$), borate ($BO_3^{3-}$), and phosphate ($PO_4^{3-}$);
   reacting said polyatomic anion and said metal containing cation to form a precursor solution; and
   printing said precursor solution on a substrate through an inkjet printhead to form an amorphous dielectric film.

15. A process according to claim 14 wherein said reacting takes place at atmospheric pressure.

16. A process according to claim 14 wherein said reacting takes place at a temperature less than 100° C.

17. A process according to claim 14 wherein said printing comprises printing a predetermined pattern on said substrate with said precursor solution through an inkjet printhead and in the absence of a mask.

18. A process according to claim 14 wherein said printing on said substrate provides an amorphous thin film having an absence of organics, and wherein said amorphous thin film is adapted for deposition of a subsequent film thereon in the absence of an annealing step.

19. A process according to claim 14 wherein said providing a metal containing cation comprises providing an aqueous solution containing a metal containing cation including one or more of hafnium ($Hf^{4+}$), titanium ($Ti^{4+}$), zirconium ($Zr^{4+}$), cerium ($Ce^{4+}$), tin ($Sn^{4+}$), tantalum ($Ta^{5+}$), niobium ($Nb^{5+}$), yttrium ($Y^{3+}$), molybdenum ($Mo^{4+}$), tungsten ($W^{6+}$), aluminum ($Al^{3+}$), gallium ($Ga^{3+}$), zinc ($Zn^{2+}$), chromium ($Cr^{3+}$), iron ($Fe^{3+}$), bismuth ($Bi^{3+}$), lanthanides, hafnium suboxide ($HfO^{2+}$), zirconium suboxide ($ZrO^{2+}$), titanium suboxide ($TiO^{2+}$), tantalum suboxide ($TaO^{3+}$), yttrium suboxide ($YO^+$), niobium suboxide ($NbO^{3+}$), molybdenum suboxide ($MoO^{4+}$), tungsten suboxide ($WO^{4+}$), aluminum suboxide ($AlO^+$), gallium suboxide ($GaO^+$), suboxides of the lanthanide series, hafnium oxy-hydroxide ($HfO_y(OH)_z^{(4-2y-z)+}$), zirconium oxy-hydroxide ($ZrO_y(OH)_z^{(4-2y-z)+}$), titanium oxy-hydroxide ($TiO_y(OH)_z^{(4-2y-z)+}$), tantalum oxy-hydroxide ($TaO_y(OH)_z^{(5-2y-z)+}$), yttrium oxy-hydroxide ($YO_y(OH)_z^{(3-2y-z)+}$), niobium oxy-hydroxide ($NbO_y(OH)_z^{(4-2y-z)+}$), molybdenum oxy-hydroxide ($MoO_y(OH)_z^{(4-2y-z)+}$), tungsten oxy-hydroxide ($WO_y(OH)_z^{(6-2y-z)+}$), aluminum oxy-hydroxide ($AlO_y(OH)_z^{(3-2y-z)+}$), gallium oxy-hydroxide ($GaO_y(OH)_z^{(3-2y-z)+}$), zinc oxy-hydroxide ($ZnO_y(OH)_z^{(2-2y-z)+}$), chromium oxy-hydroxide ($CrO_y(OH)_z^{(3-2y-z)+}$), iron oxy-hydroxide ($FeO_y(OH)_z^{(3-2y-z)+}$), bismuth oxy-hydroxide ($BiO_y(OH)_z^{(3-2y-z)+}$), and oxy-hydroxides of the lanthanide series, and wherein said providing a polyatomic anion comprises providing an aqueous solution containing a polyatomic anion including one or more of sulfate ($SO_4^{2-}$), borate ($BO_3^{3-}$), phosphate ($PO_4^{3-}$), tungstate ($WO_4^{2-}$), and silicate ($SiO_4^{4-}$).

20. A process of depositing a dielectric film, comprising:
   providing a metal containing cation that includes one or more of hafnium suboxide ($HfO^{2+}$), zirconium suboxide ($ZrO^{2+}$), titanium suboxide ($TiO^{2+}$), tantalum suboxide ($TaO^{3+}$), yttrium suboxide ($YO^+$), niobium suboxide ($NbO^{3+}$), molybdenum suboxide ($MoO^{4+}$), tungsten suboxide ($WO^{4+}$), aluminum suboxide ($AlO^+$), gallium suboxide ($GaO^+$), and suboxides of the lanthanide series;
   providing a polyatomic anion including one or more of sulfate ($SO_4^{2-}$), borate ($BO_3^{3-}$), and phosphate ($PO_4^{3-}$);
   reacting said polyatomic anion with said metal containing cation to form a precursor solution; and
   applying said precursor solution on a substrate by an application chosen from the group including spin-coating, dip-coating, spray-coating, and inkjet printing to form a non-crystalline dielectric film.

21. A method according to claim 20 wherein said reacting takes place at a temperature of at most 100° C.

22. A method according to claim 20 wherein said reacting takes place at a temperature in a range of 60° C. to 350° C.

23. A method according to claim 20 wherein said reacting takes place at atmospheric pressure in ambient air.

24. A method according to claim 20 wherein the method further comprises adding a cation dopant to said precursor solution, wherein said cation dopant includes one or more of titanium ($Ti^{4+}$), zirconium ($Zr^{4+}$), cerium ($Ce^{4+}$), tin ($Sn^{4+}$), tantalum ($Ta^{5+}$) and niobium ($Nb^{5+}$), and wherein said cation dopant is added in a range of 1 cation atomic percent to 50 cation atomic percent of said precursor solution.

25. A method of depositing a dielectric film, comprising:
   reacting a polyatomic anion with a metal containing cation to form a liquid solution; and
   printing said liquid solution on a substrate through a nozzle to form an amorphous dielectric film;
   wherein said metal containing cation includes one or more of hafnium suboxide ($HfO^{2+}$), zirconium suboxide ($ZrO^{2+}$), titanium suboxide ($TiO^{2+}$), tantalum suboxide ($TaO^{3+}$), yttrium suboxide ($YO^+$), niobium suboxide ($NbO^{3+}$), molybdenum suboxide ($MoO^{4+}$), tungsten suboxide ($WO^{4+}$), aluminum suboxide ($AlO^+$), gallium suboxide ($GaO^+$), and suboxides of the lanthanide series and wherein said polyatomic anion includes one or more of sulfate ($SO_4^{2-}$), borate ($BO_3^{3-}$), and phosphate ($PO_4^{3-}$).

26. An electronic device including a dielectric film, wherein said dielectric film is manufactured from components comprising:
   a metal containing cation that includes one or more of hafnium suboxide ($HfO^{2+}$), zirconium suboxide ($ZrO^{2+}$), titanium suboxide ($TiO^{2+}$), tantalum suboxide ($TaO^{3+}$), yttrium suboxide ($YO^+$), niobium suboxide ($NbO^{3+}$), molybdenum suboxide ($MoO^{4+}$), tungsten suboxide ($WO^{4+}$), aluminum suboxide ($AlO^+$), gallium suboxide ($GaO^+$), and suboxides of the lanthanide series; and
   a polyatomic anion including one or more of sulfate ($SO_4^{2-}$), borate ($BO_3^{3-}$), and phosphate ($PO_4^{3-}$);
   wherein said dielectric film is non-crystalline.

27. A device according to claim 26 wherein said device includes one or more of a field effect transistor and a capacitor.

28. A device according to claim 26 wherein said dielectric film has a breakdown electric field strength of greater than 2.0 MV/cm.

29. A device according to claim 26 wherein said dielectric film has substantially no mass loss in a temperature range of approximately 200 to 740° C.

30. A device according to claim 26 wherein said dielectric film is substantially impervious to acidic solutions.

31. A device according to claim 26 wherein said dielectric film is substantially impervious to basic solutions.

32. A device according to claim 26 wherein said dielectric film has a dielectric constant of at least 5.

33. A device according to claim 26 wherein said dielectric film has a current density of up to 1.0 microamp/cm$^2$ for an applied field of up to 2.2 MV/cm.

34. A device according to claim 26 wherein said dielectric film has a breakdown electric field strength of at least 3.5 MV/cm.

35. A device according to claim 26 wherein said dielectric film has a dielectric constant of at least 13.

36. A device according to claim 26 wherein said dielectric film has a breakdown electric field strength of at least 4.0 MV/cm.

* * * * *